United States Patent
Pyun et al.

(10) Patent No.: US 12,431,046 B2
(45) Date of Patent: Sep. 30, 2025

(54) ELECTRONIC DEVICE AND ELECTRONIC DEVICE TESTING METHOD

(71) Applicant: Samsung Display Co., Ltd., Yongin-si (KR)

(72) Inventors: Kihyun Pyun, Yongin-si (KR); Jang-Mi Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 470 days.

(21) Appl. No.: 18/087,627

(22) Filed: Dec. 22, 2022

(65) Prior Publication Data

US 2023/0351932 A1 Nov. 2, 2023

(30) Foreign Application Priority Data

Apr. 29, 2022 (KR) .................. 10-2022-0053782

(51) Int. Cl.
*G09G 3/00* (2006.01)
*H05K 1/18* (2006.01)
(Continued)

(52) U.S. Cl.
CPC ............. *G09G 3/006* (2013.01); *H05K 1/189* (2013.01); *H10K 50/844* (2023.02);
(Continued)

(58) Field of Classification Search
CPC ............. G09G 3/006; G09G 2330/021; G09G 2330/025; G09G 2330/04; G09G 3/3225;
(Continued)

(56) References Cited

U.S. PATENT DOCUMENTS 6,380,688 B1 *  4/2002  Bae ...................... G09G 3/3233
                                                                     345/60
9,392,653 B2 *  7/2016  Lee ...................... H05B 45/3725
                            (Continued)

FOREIGN PATENT DOCUMENTS

KR          100675622         2/2007
KR          101981281         5/2019
                            (Continued)

*Primary Examiner* — S M Sohel Imtiaz
(74) *Attorney, Agent, or Firm* — CANTOR COLBURN LLP

(57) ABSTRACT

An electronic device includes: a display panel including an active area including a first region and a second region, a plurality of first circuit films, a plurality of second circuit films, a first circuit board, a second circuit board, a first circuit cable, a second circuit cable, and a main circuit board. The main circuit board includes: a power generation unit, which provides power to the display panel, a first power measurement unit electrically connected to the first circuit cable and the power generation unit, and, which measures a first current provided to the first region, a second power measurement unit electrically connected to the second circuit cable and the power generation unit, and, which measures a second current provided to the second region, and an overcurrent protection unit, which cuts off the power based on the reference current and each of the first and second currents.

20 Claims, 10 Drawing Sheets

(51) Int. Cl.
  *H10K 50/844*    (2023.01)
  *H10K 59/131*    (2023.01)
(52) U.S. Cl.
  CPC ..... *H10K 59/131* (2023.02); *G09G 2330/021* (2013.01); *G09G 2330/025* (2013.01); *G09G 2330/04* (2013.01); *H05K 2201/10136* (2013.01)
(58) Field of Classification Search
  CPC .............. G09G 3/3208; H05K 1/189; H05K 2201/10136; H10K 50/844; H10K 59/131; H02H 3/08; G01R 19/0092; G01R 19/165
  See application file for complete search history.

(56) References Cited

U.S. PATENT DOCUMENTS

| | | | |
|---|---|---|---|
| 9,722,410 B2* | 8/2017 | Kim | G09G 3/20 |
| 2017/0162092 A1* | 6/2017 | Kim | G09G 3/006 |
| 2017/0192065 A1* | 7/2017 | Lee | G09G 3/3283 |
| 2018/0151849 A1* | 5/2018 | Kim | H10K 71/00 |
| 2020/0365067 A1* | 11/2020 | Nam | G09G 3/006 |
| 2021/0343204 A1* | 11/2021 | Shin | G09G 3/006 |
| 2022/0293021 A1* | 9/2022 | Hong | G09G 3/3225 |
| 2023/0065092 A1* | 3/2023 | Kim | G09G 3/006 |
| 2023/0317013 A1* | 10/2023 | Lee | G09G 3/3233 345/87 |

FOREIGN PATENT DOCUMENTS

| | | |
|---|---|---|
| KR | 101960762 | 7/2019 |
| KR | 102055591 | 12/2019 |
| KR | 102174856 | 11/2020 |

* cited by examiner

ELECTRONIC DEVICE AND ELECTRONIC DEVICE TESTING METHOD

This application claims priority to Korean Patent Application No. 10-2022-0053782, filed on May 23, 2022, and all the benefits accruing therefrom under U.S.C. § 119, the content of which in its entirety is herein incorporated by reference.

BACKGROUND

The present disclosure herein relates to an electronic device with improved reliability, and an electronic device testing method.

Various electronic devices, which are used in a multimedia device such as a television, a mobile phone, a tablet computer, a navigator, a game player or the like, are being developed.

As the field of usage of such an electronic device becomes diversified, the type of a display panel for displaying an image to be displayed on the electronic device becomes also diversified.

The display panel includes an emissive display panel, and the emissive display panel may include an organic light emitting display panel, a quantum dot display panel or the like.

SUMMARY

The present disclosure provides an electronic device with improved reliability, and an electronic device testing method.

An embodiment of the invention provides an electronic device including: a display panel in which an active area, and a non-active area adjacent to the active area are defined, where the active area includes a first region and a second region adjacent to the first region in a first direction; a plurality of first circuit films electrically connected with the first region; a plurality of second circuit films electrically connected with the second region; a first circuit board electrically connected with the plurality of first circuit films; a second circuit board electrically connected with the plurality of second circuit films; a first circuit cable electrically connected with the first circuit board; a second circuit cable electrically connected with the second circuit board; and a main circuit board electrically connected with the first circuit cable and the second circuit cable, and, which receives an image signal and output a protection signal. The main circuit board comprises: a power generation unit, which provides power to the display panel; a first power measurement unit electrically connected with the first circuit cable and the power generation unit, and, which measures a first current provided to the first region through the first circuit cable and the first circuit board; a second power measurement unit electrically connected to the second circuit cable and the power generation unit, and, which measures a second current provided to the second region through the second circuit cable and the second circuit board; and an overcurrent protection unit, which determines whether to output the protection signal for cutting off the power based on a reference current output according to the image signal and each of the first and second currents.

In an embodiment, the first circuit cable may include: a first power pad and a plurality of first pads spaced apart from the first power pad in the first direction, where the first power pad is electrically connected to the power generation unit; the second circuit cable may include a second power pad and a plurality of second pads spaced apart from the second power pad in the first direction, the second power pad is electrically connected to the power generation unit; and the display panel may include a power line electrically connected to the first power pad and the second power pad, and the power line extends in the first direction.

In an embodiment, the first current may be provided to the first power pad, and the second current may be provided to the second power pad.

In an embodiment, the electronic device may further include driving chips mounted on the plurality of first circuit films and the plurality of second circuit films, respectively.

In an embodiment, the main circuit board may further include: a total load calculation unit, which receives the image signal, generates a current control signal for the first region and the second region based on the image signal, and calculates a total load for the active area based on the image signal; a first load calculation unit, which receives the image signal and calculates a first load for the first region based on the image signal and the current control signal; and a second load calculation unit, which receives the image signal and calculates a second load for the second region based on the image signal and the current control signal.

In an embodiment, the electronic device may further include: a target current setting unit, which calculates a total target current provided to the display panel, a first target current provided to the first region, and a second target current provided to the second region based on the total load, the first load and the second load, and provides the total target current, the first target current, and the second target current to the overcurrent protection unit.

In an embodiment, the overcurrent protection unit may output the reference current based on the first target current and the second target current.

In an embodiment, a current value of the reference current may be output based on a lookup table regarding relations between the first target current, the second target current, or the reference current that are stored in advance.

In an embodiment, the reference current may have a current value obtained by multiplying a prescribed ratio by each of the first target current and the second target current.

In an embodiment, the first region may be a half of the active area, and the second region is the other half of the active area.

In an embodiment, the reference current may include a total reference current, a first reference current for the first region, and a second reference current for the second region.

In an embodiment, the reference current may be larger than each of the first target current and the second target current.

In an embodiment, when at least one of the first current or the second current is larger than the reference current, the overcurrent protection unit may output the protection signal.

In an embodiment, the overcurrent protection unit may determine whether the first circuit cable or the second circuit cable is connected.

In an embodiment of the invention, an electronic device testing method includes: providing an electronic device comprising a display panel in which an active area comprising a first region and a second region adjacent to the first region in a first direction, and a non-active area adjacent to the active area are defined, and a main circuit board electrically connected with the display panel and, which provides power comprising first power and second power to the display panel and receives an image signal; providing the first power to the first region; providing the second power to the second region; measuring a first current of the first power; measuring a second current of the second power; and cutting off the power based on a reference current output according to the image signal and each of the first and second currents.

In an embodiment, the electronic device testing method may further include: receiving the image signal, generating a current control signal for the first region and the second region based on the image signal, and calculating a total load for the active area based on the image signal.

In an embodiment, the electronic device testing method may further include: receiving the image signal and calculating a first load for the first region based on the image signal and the current control signal; and receiving the image signal and calculating a second load for the second region based on the image signal and the current control signal.

In an embodiment, the electronic device testing method may further include calculating a total target current provided to the display panel based on the total load, a first target current provided to the first region based on the first load, and a second target current provided to the second region based on the second load, and the cutting off the power comprises calculating the reference current based on the total target current, the first target current, and the second target current.

In an embodiment, the cutting off the power may not be performed, when the reference current is larger than each of the first current and the second current.

In an embodiment, the cutting off the power may be performed, when at least one of the first current or the second current is larger than the reference current.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
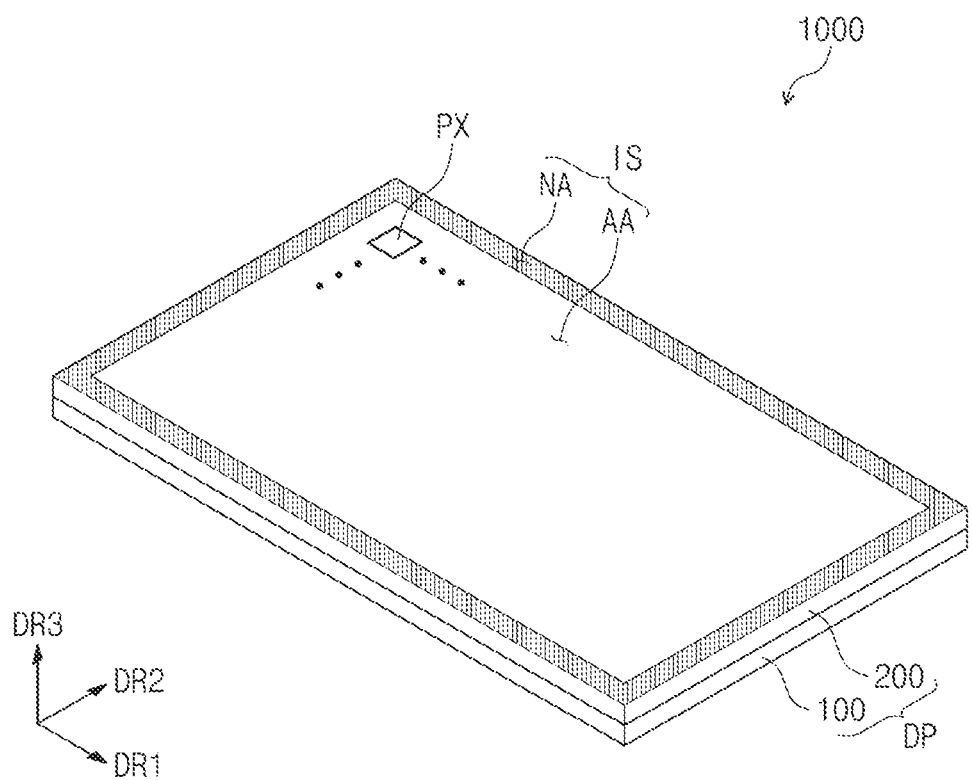
FIG. 1A is a perspective view of an electronic device according to an embodiment of the invention.

It will be understood that when an element or layer is referred to as being "on," "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated items.

Terms such as "first," "second," and the like may be used to describe various components, but these components should not be limited by the terms. These terms are only used to distinguish one element from another. For instance, a first component may be referred to as a second component, or similarly, a second component may be referred to as a first component, without departing from the scope of the present disclosure. The singular expressions include plural expressions unless the context clearly dictates otherwise.

In addition, the terms such as "under," "lower," "on", and "upper" are used for explaining associations of items illustrated in the drawings. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which example embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to the accompanying drawings.

Figure 1B:
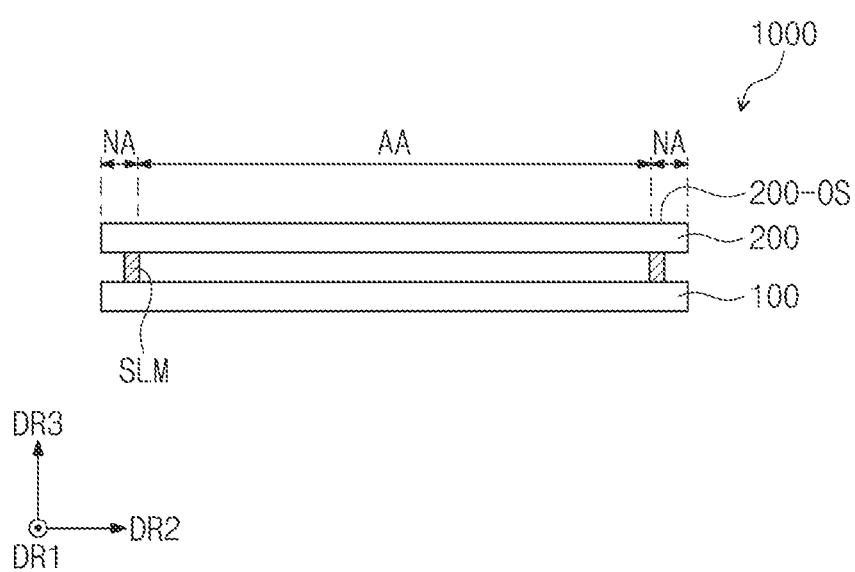
FIG. 1B is a cross-sectional view of an electronic device according to an embodiment of the invention.

FIG. 1A is a perspective view of an electronic device according to an embodiment of the invention, and FIG. 1B is a cross-sectional view of an electronic device according to an embodiment of the invention.

Referring to FIGS. 1A and 1B, an electronic device 1000 may be a component configured to substantially generate an image. The electronic device 1000 may be an emissive electronic device or a non-emissive electronic device. For example, the electronic device 1000 may be one of among an organic light emitting display device ("OLED"), a quantum dot LED device, a micro-LED display device, a nano LED display device, a liquid crystal display device, an electrophoretic display device, an electrowetting display device, or a MEMS display device, but is not particularly limited.

The electronic device 1000 may include a display panel DP. The display panel DP may include a first substrate 100 (or a lower display substrate) and a second substrate 200 (or an upper display substrate) facing and spaced apart from the first substrate 100. A prescribed cell gap may be provided between the first substrate 100 and the second substrate 200. The cell gap may be maintained by a sealant SLM configured to bond the first substrate 100 and the second substrate 200. The cell gap may be filled with an insulation material.

A grayscale display panel may be disposed between a base substrate of the first substrate 100 and a base substrate of the second substrate 200. The grayscale display panel may include a liquid crystal layer, an organic light emitting layer, an inorganic light emitting layer (e.g., a quantum dot light emitting layer or an LED light emitting layer), or an electrophoretic layer according to the type of the electronic device 1000.

The electronic device 1000 may display an image through a display surface IS. The outer surface 200-OS of the second substrate 200 shown in FIG. 1B may be defined as the display surface IS of FIG. 1.

The display surface IS is parallel to a surface defined by a first direction DR1 and a second direction DR2. The display surface ID may include an active area AA and a non-active area NA. Pixels PX may be disposed in the active area AA, and pixels PX may not be disposed in the non-active area NA. The non-active area NA may be defined along the edge of the display surface IS. The non-active area NA may surround the active area AA. In an embodiment of the invention, the non-active area NA may be omitted or disposed only at one side of the active area AA.

The normal direction of the display surface IS, namely, the thickness direction of the electronic device 1000 may indicate a third direction DR3. The front surfaces (or top surfaces) and the rear surfaces (or bottom surfaces) of respective layers or units, which will be described hereinafter, may be divided by the third direction DR3.

In an embodiment of the invention, the electronic device 1000 is illustrated to include a planar display surface IS, but is not limited thereto. The electronic device 1000 may include a curved display surface or a solid display surface. The solid display surface may include a plurality of display areas indicating different directions.

Figure 2A:
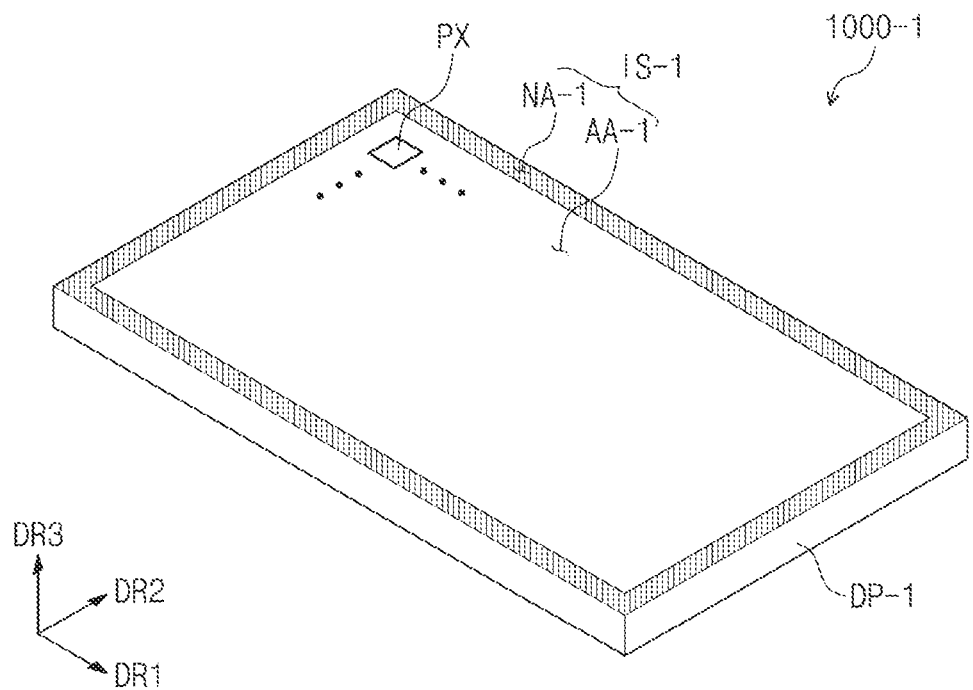
FIG. 2A is a perspective view of an electronic device according to an embodiment of the invention.
Figure 2B:
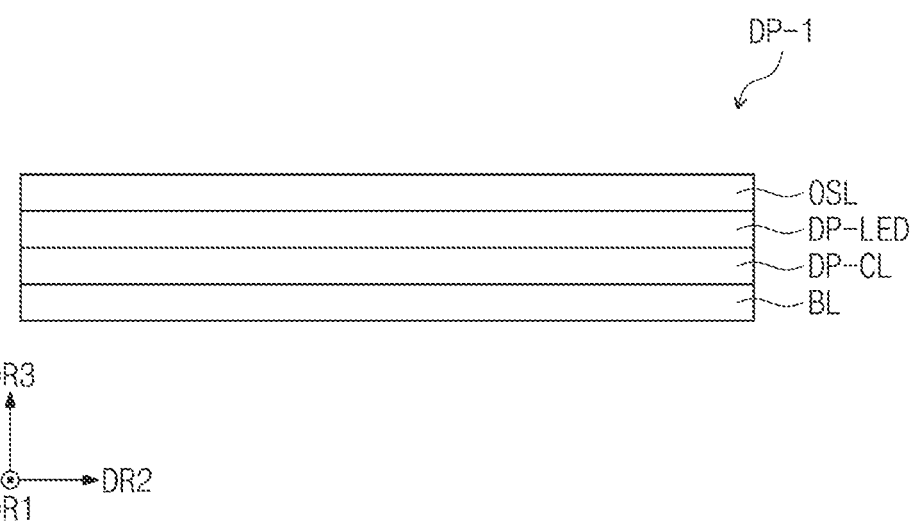
FIG. 2B is a cross-sectional view of an electronic device according to an embodiment of the invention.

FIG. 2A is a perspective view of an electronic device according to an embodiment of the invention. FIG. 2B is a cross-sectional view of a display panel according to an embodiment of the invention. In a description about FIG. 2A, like reference numerals are given to like elements described with reference to FIG. 1A, and descriptions thereabout will be omitted.

Referring to FIGS. 2A and 2B, an electronic device 1000-1 may display an image through a display surface IS-1. The display surface IS-1 may be parallel to a surface defined by the first direction DR1 and the second direction DR2. The display surface IS-1 may include an active area AA-1 and a non-active area NA-1.

The display panel DP-1 may include a base layer BL, a circuit element layer DP-CL, a display element layer DP-LED, and an optical structure layer OSL. The base layer BL may include a synthetic resin substrate or a glass substrate. The circuit element layer DP-CL includes at least one insulating layer and circuit element. The circuit element includes signal lines and a pixel driving circuit, etc. The circuit element layer DP-CL may be provided through processes for providing an insulating layer, a semiconductor layer, and a conductive layer by coating, deposition and the like, photolithography processes for the insulating layer, the semiconductor layer, and the conductive layer, and a patterning process for the conductive layer. The display element layer DP-LED includes at least a display element. The optical structure layer OSL may convert the color of light provided from the display element. The optical structure layer OSL may include a light control pattern and a structure for increasing a conversion efficiency of the light.

Figure 3:
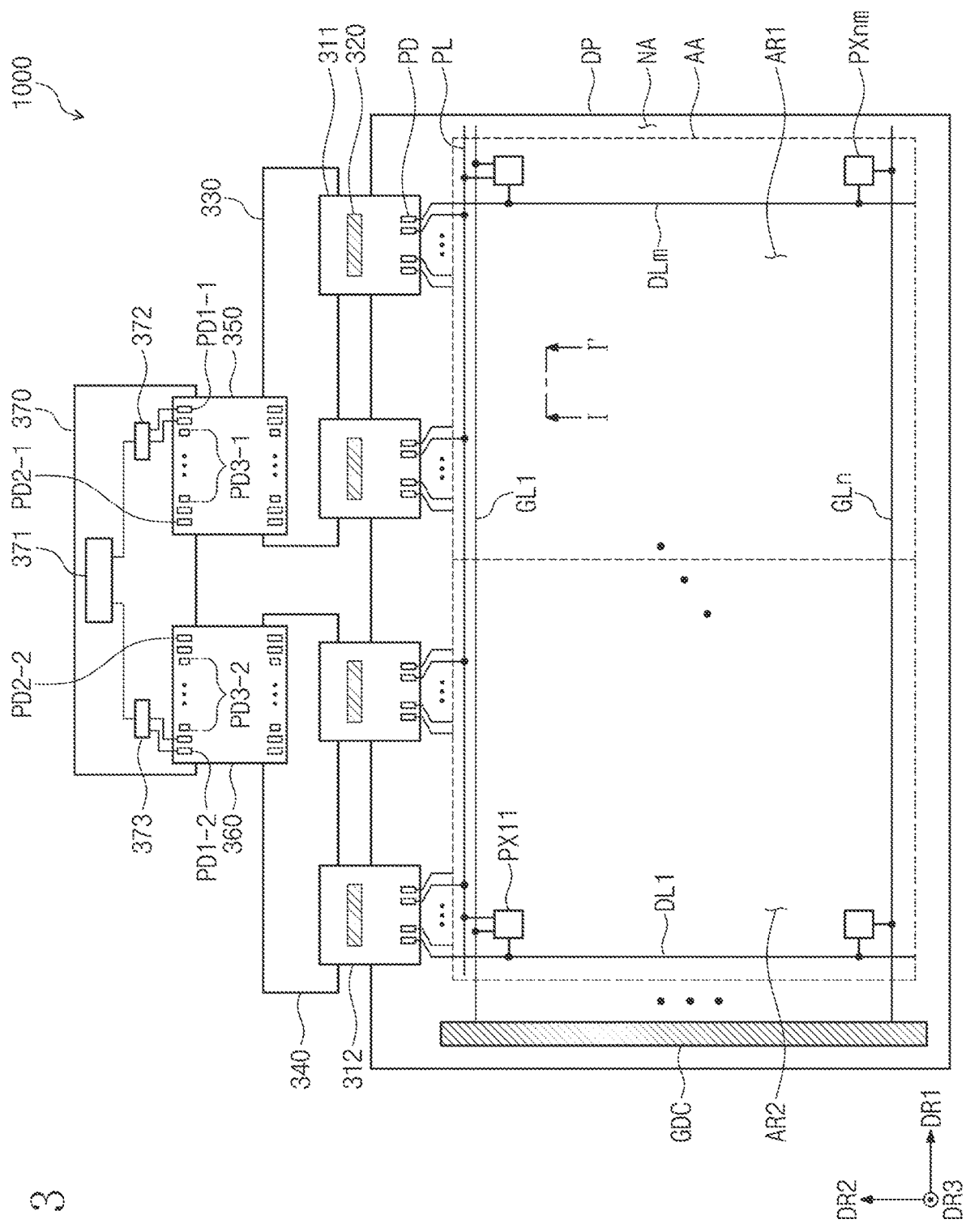
FIG. 3 is a plan view of an electronic device according to an embodiment of the invention.

FIG. 3 is a plan view of an electronic device according to an embodiment of the invention.

Referring to FIG. 3, the display panel DP may include a plurality of signal lines GL1 to GLn and DL1 to DLm, a power line PL, and pixels PX11 to PXnm. FIG. 3 shows a planar disposition relationship of the plurality of signal lines GL1 to GLn and DL1 to DLm, the power line PL, and the pixels PX11 to PXnm. The plurality of signal lines GL1 to GLn and DL1 to DLm may include a plurality of gate lines GL1 to GLn, and a plurality of data lines DL1 to DLm.

The display panel DP may include the active area AA and the non-active area NA adjacent to the active area AA. The active area AA and the non-active area NA may be divided by whether the plurality of pixels PX11 to PXnm are disposed therein. The plurality of pixels PX11 to PXnm may be disposed in the active area AA, and not be disposed in the non-display area NA.

Each of the plurality of pixels PX11 to PXnm may be connected to a corresponding gate line among the plurality of gate lines GL1 to GLn and a corresponding data line among the plurality of data lines DL1 to DLm. Each of the plurality of pixels PX11 to PXnm may be electrically connected to the power line PL. Each of the pixels PX11 to PXnm may include a pixel driving circuit and a display element. The electronic device 1000 may include more types of signal lines according to the configuration of the pixel driving circuit of the pixels PX11 to PXnm.

A scan driving circuit GDC and a plurality of pads PD may be disposed in the non-active area NA. The scan driving circuit GDC may be provided through the same processes as the circuits in the electronic device 1000. Some of the plurality of pads PD may be electrically connected to the plurality of data lines DL1 to DLm. The others of the plurality of pads PD may be electrically connected to the power line PL.

The active area AA may include a first region AR1 and a second region AR2. The first region AR1 and the second region AR2 may be spaced apart from each other in the first direction DR1. The first region AR1 may be a half of the active area AA. The second region AR2 may be the other half of the active area AA. However, this is an example, and the areas of the first region AR1 and the second region AR2 are not limited thereto. For example, the area of one of the first region AR1 and the second region AR2 may be larger than an area of the other.

A plurality of first circuit films 311 may be electrically connected to the first region AR1. The plurality of first circuit films 311 may be connected to the plurality of pads PD disposed in the non-active area NA. The plurality of first circuit films 311 may provide electrical signals for driving the display panel DP to the display panel DP. The plurality of first circuit films 311 may be electrically connected to the display panel DP through the plurality of pads PD. In an embodiment of the invention, each of the plurality of first circuit films 311 may be a flexible circuit film.

A plurality of second circuit films 312 may be electrically connected to the second region AR2. The plurality of second circuit films 312 may be connected to a plurality of pads PD disposed in the non-active area NA. The plurality of second circuit films 312 may provide electrical signals for driving the display panel DP to the display panel DP. The plurality of second circuit films 312 may be electrically connected to the display panel DP through the plurality of pads PD. In an embodiment of the invention, each of the plurality of second circuit films 312 may be a flexible circuit film.

Driving chips 320 may be mounted on the plurality of first circuit films 311 and the plurality of second circuit films 312, respectively. For example, the driving chips 320 may be mounted on the plurality of first circuit films 311 and the plurality of second circuit films 312, respectively, in a chip-on-film ("COF") manner. Each of the driving chips 320 may be a driving chip configured to transfer an electrical signal to the display panel DP. A data driving circuit may be a partial circuit provided in the each of the driving chips 320. The driving chips 320 may be electrically connected to the plurality of pixels PX11 to PXnm through the pads PD disposed in the non-active area NA.

A first circuit board 330 may be electrically connected to the plurality of first circuit films 311. The first circuit board 330 may transfer signals, which are transferred from a main circuit board 370, to the plurality of first circuit films 311. In an embodiment of the invention, the first circuit board 330 may be a printed circuit board.

A second circuit board 340 may be electrically connected to the plurality of second circuit films 312. The second circuit board 340 may transfer signals, which are transferred from the main circuit board 370, to the plurality of second circuit films 312. In an embodiment of the invention, the second circuit board 340 may be a printed circuit board.

A first circuit cable 350 may be electrically connected to the first circuit board 330. The first circuit cable 350 may be disposed between the first circuit board 330 and the main circuit board 370 to electrically connect the first circuit board 330 and the main circuit board 370. In an embodiment of the invention, the first circuit cable 350 may be a flat flexible cable ("FFC"). The first circuit cable 350 may include a first power pad PD1-1, a second power pad PD2-1, and a plurality of pads PD3-1. The plurality of pads PD3-1 may be disposed between the first power pad PD1-1 and the second power pad PD2-1. The plurality of pads PD3-1 may be spaced apart from the first power pad PD1-1 and the second power pad PD2-1 in the first direction DR1.

In a plan view, each of the areas of the first power pad PD1-1 and the second power pad PD2-1 may be larger than the area of each of the plurality of pads PD3-1. The first power pad PD1-1 may provide power to the display panel DP. The power may be provided to the power line PL. The second power pad PD2-1 may provide common power to the display panel DP. The common power may have a lower voltage level than the power. The plurality of pads PD3-1 may transfer electrical signals, which are transferred from the main circuit board 370, to the display panel DP. The electrical signal may be a signal for driving the display panel DP. The electrical signal transferred to the display panel DP may have a lower voltage level than each of the power and the common voltage.

Unlike the invention, when each of the areas of the first power pad PD1-1 and the second power pad PD2-1 is the same as each of the plurality of pads PD3-1 or smaller, the power and the common power having higher voltages or higher currents than the electrical signal may not be easily transferred. However, according to the invention, each of the areas of the first power pad PD1-1 and the second power pad PD2-1 for transferring the power and the common power to the display panel DP may be larger than the area of each of the plurality of pad PD3-1. In other words, each of the first power pad PD1-1 and the second power pad PD2-1 may easily transfer the power and the common power having higher currents to the display panel DP. Accordingly, the electronic device 1000 with improved reliability may be provided.

The second circuit cable 360 may be electrically connected to the second circuit board 340. The second circuit cable 360 may be disposed between the second circuit board 340 and the main circuit board 370 to electrically connect the second circuit board 340 and the main circuit board 370. In an embodiment of the invention, the second circuit cable 360 may be a flat flexible cable. The second circuit cable 360 may include a first power pad PD1-2, a second power pad PD2-2 and a plurality of pads PD3-2. The plurality of pads PD3-2 may be disposed between the first power pad PD1-2 and the second power pad PD2-2. The plurality of pads PD3-2 may be spaced apart from the first power pad PD1-2 and the second power pad PD2-2 in the first direction DR1.

In a plan view, each of the areas of the first power pad PD1-2 and the second power pad PD2-2 may be larger than the area of each of the plurality of pads PD3-2. The first power pad PD1-2 may provide power to the display panel DP. The power may be provided to the power line PL. The second power pad PD2-2 may provide common power to the display panel DP. The common power may have a lower voltage level than the power. The plurality of pads PD3-2 may transfer an electrical signal, which is transferred from the main circuit board 370, to the display panel DP. The electrical signal transferred to the display panel DP may be a signal for driving the display panel DP. The electrical signal may have a lower voltage level than each of the power and the common power.

According to the invention, each of the areas of the first power pad PD1-2 and the second power pad PD2-2 for transferring the power and the common power to the display panel DP may be larger than the area of each of the plurality of pad PD3-2. In other words, the first power pad PD1-2 and the second power pad PD2-2 may easily transfer the power and the common power having higher currents to the display panel DP. Accordingly, the electronic device 1000 with improved reliability may be provided.

The main circuit board 370 may be electrically connected to the second circuit board 340 and the second circuit cable 360. In an embodiment of the invention, the main circuit board 370 may be a printed circuit board.

The main circuit board 370 may include a power generation unit 371, a first power measurement unit 372, and a second power measurement unit 373. The power generation unit 371 may generate the power and/or the common power. The power generation unit 371 may provide the power and/or the common power to the display panel DP. The first power measurement unit 372 may be disposed between the first circuit cable 350 and the power generation unit 371 to be electrically connected with the first circuit cable 350 and the power generation unit 371. The second power measurement unit 373 may be disposed between the second circuit cable 360 and the power generation unit 371 to be electrically connected with the second circuit cable 360 and the power generation unit 371. The main circuit board 370 may be described later.

Each of the plurality of first circuit films 311 and the plurality of second circuit films 312 according to an embodiment of the invention may be bent towards the rear surface of the display panel DP. Accordingly, the first circuit board 330, the second circuit board 340, the first circuit cable 350, the second circuit cable 360, and the main circuit board 370 may face the rear surface of the display panel DP.

Figure 4:
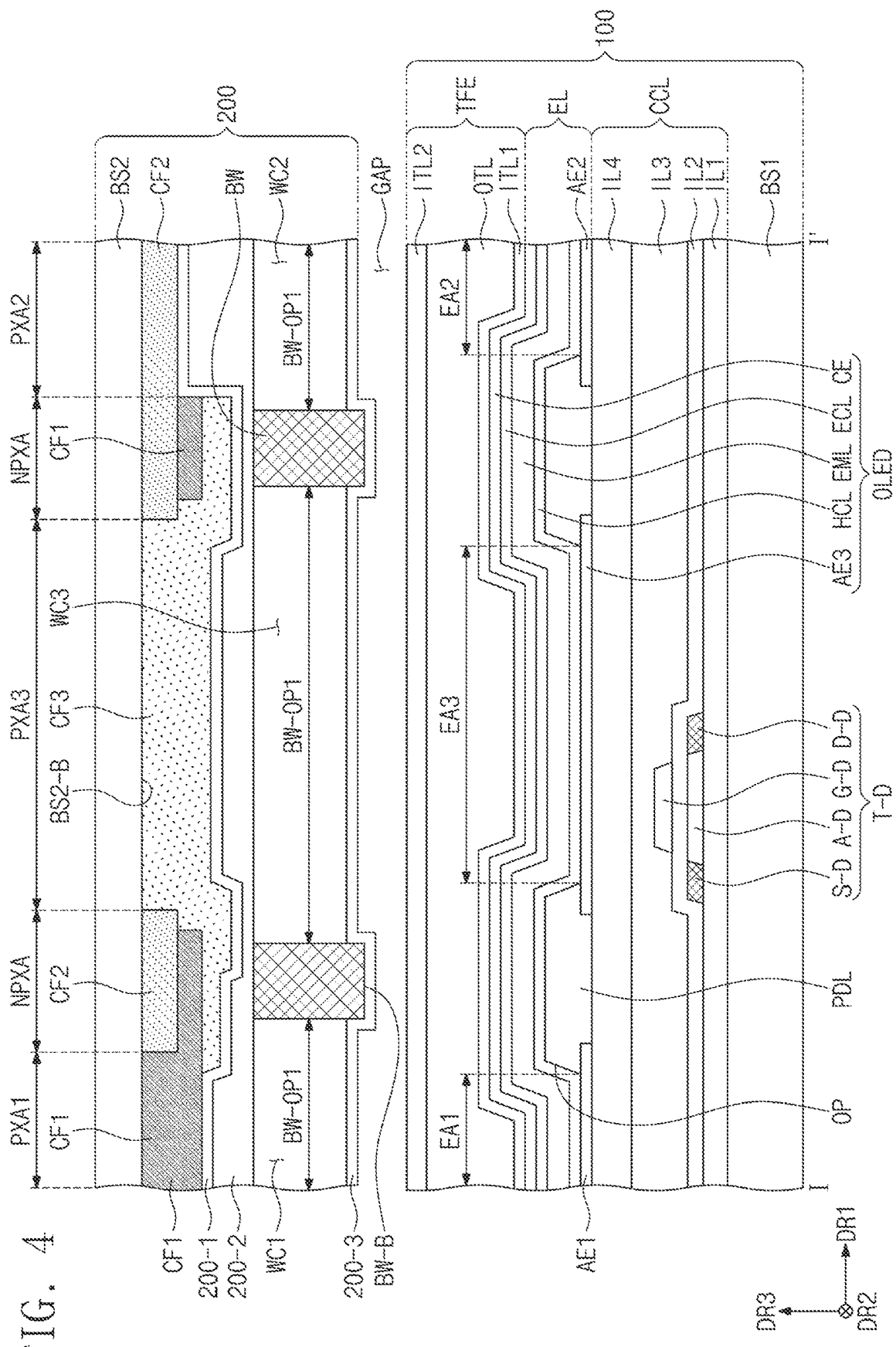
FIG. 4 is a cross-sectional view cut along line I-I' of FIG. 3 according to an embodiment of the invention.

FIG. 4 is a cross-sectional view cut along line I-I' of FIG. 3 according to an embodiment of the invention.

Referring to FIGS. 3 and 4, the electronic device 1000 may include the first substrate 100 and the second substrate 200 that faces and is spaced apart from the first substrate 100. A prescribed cell gap GAP may be provided between the first substrate 100 and the second substrate 200. The cell gap GAP may be maintained by a sealant SLM configured to bond the first substrate 100 and the second substrate 200. The sealant may be disposed in the non-active area NA shown in FIG. 1. In an embodiment of the invention, a synthetic resin material may be disposed in the cell gap GAP. However, this is an example, and the structure of the electronic device 1000 is not limited thereto. For example, a partial configuration of the second substrate 200 may be directly disposed on the first substrate 100 to provide the display panel DP-1 of FIG. 2B.

A first pixel area PXA1, a second pixel area PXA2, a third pixel area PXA3, and a non-pixel area NPXA may be defined in the display panel DP.

The first substrate 100 may include a first base substrate BS1 (or a base substrate), a circuit layer CCL, a display element layer EL, and a thin-film encapsulation layer TFE. The circuit layer CCL may be disposed on the first substrate BS1. The circuit layer CCL may include a plurality of insulating layers, a plurality of conductive layers, and a semiconductor layer. The display element layer EL may be disposed on the circuit layer CCL. The thin-film encapsulation layer TFE may be disposed on the display element layer EL to encapsulate the display element layer EL.

The first base substrate BS1 may have a laminated structure including a silicon substrate, a plastic substrate, a glass substrate, an insulating film, or a plurality of insulating layers.

The circuit layer CCL may include a plurality of transistors and a plurality of insulating layers IL1, IL2, IL3, and IL4. A single driving transistor T-D is illustrated as an example in FIG. 4. The plurality of insulating layers IL1, IL2, IL3, and IL4 may include a first insulating layer IL1, a second insulating layer IL2, a third insulating layer IL3, and a fourth insulating layer IL4.

The first insulating layer IL1 may be disposed on the first base substrate BS1 and the driving transistor T-D may be disposed on the first insulating layer IL1. The driving transistor T-D may include an active A-D, a source S-D and a drain D-D, and a gate G-D.

The active A-D, the source S-D and the drain D-D may be regions divided according to a doping concentration or the conductivity of a semiconductor pattern. The active A-D, the source S-D and the drain D-D may be disposed on the first insulating layer IL1. The active A-D, the source S-D and the drain D-D may have a higher adhesive force to the first insulating layer IL1 than the first base substrate BS1 has.

The first insulating layer IL1 may be a barrier layer configured to protect the bottom surfaces of the active A-D, the source S-D and the drain D-D. In this case, the first insulating layer IL1 may block pollutant, moisture or the like of the first base substrate BS1 itself or pollutant, moisture or the like flowed in through the first base substrate BS1 from being permeated into the active A-D, the source S-D and the drain D-D. Alternatively, the first insulating layer IL1 may be a light shielding layer configured to shield external light incident through the first base substrate BS1 from being incident to the active A-D. In this case, the first insulating layer IL1 may further include a light shielding material.

The second insulating layer IL2 may be disposed on the first insulating layer ILL and cover the active A-D, the source S-D the drain D-D. The second insulating layer IL2 may include an inorganic material. The inorganic material may include at least any one among silicon nitride, silicon oxynitride, silicon oxide, titanium oxide, or aluminum oxide.

The gate G-D may be disposed on the second insulating layer IL2. The third insulating layer IL3 may be disposed on the second insulating layer IL2 and cover the gate G-D. The third insulating layer IL3 may be provided with a single layer or a plurality of layers. For example, the single layer may include an inorganic layer. The plurality of layers may include an organic layer and an inorganic layer.

The fourth insulating layer IL4 may be disposed on the third insulating layer IL3. The fourth insulating layer IL4 may be provided with a single layer or a plurality of layers. For example, the single layer may include an organic layer. The plurality of layers may include an organic layer and an inorganic layer. The fourth insulating layer IL4 may be a planarization layer configured to provide a planar surface on a top portion.

The display element layer EL may be disposed on the fourth insulating layer IL4. The display element layer EL may include a light emitting element OLED and a pixel definition layer PDL. In an embodiment of the invention, the light emitting element OLED may be an organic light emitting diode, but is not limited thereto. For example, the light emitting element OLED may be a micro-LED element or a nano LED element. The pixel definition layer PDL may be an organic layer.

The light emitting element OLED may include a first electrode AE3 (hereinafter, a third pixel electrode), a hole control layer HCL, a light emitting layer EML, an electron control layer ECL, and a second electrode CE (or a common electrode). The third pixel electrode AE3 may be separately provided for each pixel. The light emitting element OLED may include a first light emitting element overlapping the first pixel area PXA1, a second light emitting element overlapping the second pixel area PXA2, a third light emitting element overlapping the third pixel area PXA3, and a fourth light emitting element overlapping the fourth pixel area PXA4 in a plan view. In FIG. 4, as an example, a first pixel electrode AE1 included in the first light emitting element, a second pixel electrode AE2 included in the second light emitting element, and a third pixel electrode AE3 included in the third light emitting element are illustrated.

The first pixel electrode AE1 may be disposed corresponding to the first pixel area PXA1, the second pixel electrode AE2 may be disposed corresponding to the second pixel area PXA2, and the third pixel electrode AE3 may be disposed corresponding to the third pixel area PXA3. Here, the "corresponding to" means that when viewed from the thickness direction DR3 of the electronic device 1000, the two components overlap each other in a plan view and is not limited to having the same area.

The first pixel electrode AE1, the second pixel electrode AE2, and the third pixel electrode AE3 may be disposed on the fourth insulating layer IL4. Each of the first pixel electrode AE1, the second pixel electrode AE2, and the third pixel electrode AE3 may be directly or indirectly electrically connected to a corresponding driving transistor. For example, the second pixel electrode AE2 may be directly or indirectly connected to the driving transistor T-D shown in FIG. 4. In FIG. 4, a connection structure between the second pixel electrode AE2 and the driving transistor T-D is not illustrated.

The pixel definition layer PDL may expose a portion of each of the first pixel electrode AE1, the second pixel electrode AE2, and the third pixel electrode AE3. For example, light emitting openings OP may be defined in the pixel definition layer PDL. The portion of each of the first pixel electrode AE1, the second pixel electrode AE2, and the third pixel electrode AE3 may be exposed by the light emitting openings OP.

A first light emitting area EA1, a second light emitting area EA2, and a third light emitting area EA3 may be defined by the light emitting openings OP, respectively. In addition, the first light emitting area EA1 may be defined corresponding to the first pixel area PXA1, the second light emitting area EA2 may be defined corresponding to the second pixel area PXA2, and the third light emitting area EA1 may be defined corresponding to the third pixel area PXA3. Here, the "corresponding to" means that when viewed from the thickness direction DR3 of the electronic device 1000, the two components overlap each other in a plan view, and is not limited to having the same area.

The hole control layer HCL, the light emitting layer EML, the electron control layer ECL, and the second electrode CE may be commonly disposed in the first pixel area PXA1, the second pixel area PXA2, the third pixel area PXA3, and the non-pixel area NPXA. The hole control layer HCL may include a hole transport layer, and further include a hole injection layer.

The light emitting layer EML may have a single layer structure or a tandem structure. The light emitting layer EML may generate blue light as source light. The blue light may include a wavelength of about 410 nm to about 480 nm. An emission spectrum of the blue light may have a peak wavelength belonging to a range of about 440 nm to about 460 nm. The light emitting layer EML may be commonly disposed in the first to third pixel areas PXA1, PXA2, and PXA3, or disposed independently. To be disposed independently means that the light emitting layer EML is separately disposed in each of the first to third pixel areas PXA1, PXA2, and PXA3.

The electron control layer ECL may include an electron transport layer, and further include an electron injection layer. The second electrode CE may be disposed on the electron control layer ECL. The second electrode CE may be commonly disposed to the plurality of pixels PX (see FIG. 1).

The thin-film encapsulation layer TFE may be disposed on the second electrode CE. For example, the thin-film encapsulation layer TFE may be directly disposed on the display element layer EL. The thin-film encapsulation layer TFE may include a first inorganic encapsulation layer ITL1, an organic encapsulation layer OTL and a second inorganic encapsulation layer ITL2 that are sequentially laminated. The organic encapsulation layer OTL may be disposed between the first inorganic encapsulation layer ITL1 and the second inorganic encapsulation layer ITL2. The first inorganic encapsulation layer ITL1 and the second inorganic encapsulation layer ITL2 may be provided by depositing an inorganic material, and the organic encapsulation layer OTL may be provided by depositing, printing or coating an organic material.

The first inorganic encapsulation layer ITL1 and the second inorganic encapsulation layer ITL2 may protect the display element layer EL from moisture or oxygen, or the organic encapsulation layer OTL may protect the display element layer EL from a foreign matter such as a dust particle. The first inorganic encapsulation layer ITL1 and the second inorganic encapsulation layer ITL2 may include at least any one among silicon nitride, silicon oxynitride, silicon oxide, titanium oxide, or aluminum oxide. The organic encapsulation layer OTL may include a polymer, for example, an acrylic-based organic layer. However, this is an example, and the embodiment of the invention is not limited thereto.

FIG. 4 illustrates an example that the thin film encapsulation layer TFE includes two inorganic layers and one organic layer, but the embodiment of the invention is not limited thereto. For example, the thin-film encapsulation layer TFE may include three inorganic layers and two organic layers, and in this case, the inorganic layers and the organic layers may be alternately laminated. Although not shown in the drawings, the electronic device 1000 may further include a refractive index control layer for enhancing a light emission efficiency on a top side of the thin-film encapsulation layer TFE.

The second substrate 200 may be disposed over the first substrate 100. The second substrate 200 may include a second base substrate BS2 (or a cover base substrate), a first color filter CF1, a second color filter CF2, a third color filter CF3, a first light control pattern WC1, a second light control pattern WC2, a third light control pattern WC3, a barrier wall BW, and a plurality of insulating layers 200-1, 200-2, and 200-3.

The second base substrate BS2 may be a laminated structure including a silicon substrate, a plastic substrate, a glass substrate, an insulating film, or a plurality of insulating layers. The bottom surface BS2-N of the second base substrate BS2 may be flat.

The plurality of color filters CF1, CF2, and CF3 may be disposed on one surface of the second base substrate BS2. For example, the plurality of color filters CF1, CF2, and CF3 may be disposed on the bottom surface of the second base substrate BS2. The first color filter CF1 may be disposed overlapping the first light emitting area EA1, the second color filter CF2 may be disposed overlapping the second light emitting area EA2, and the third color filter CF3 may be disposed overlapping the third light emitting area EA3 in a plan view.

The second color filter CF2 may be disposed in the second pixel area PXA2 and the non-pixel area NPXA. A plurality of openings may be defined in the second color filter CF2. The plurality of openings may define the first pixel area PXA1 and the third pixel area PXA3. The first color filter CF1 may be disposed overlapping the first pixel area PXA1, and the third color filter CF3 may be disposed overlapping the third pixel area PXA3 in a plan view.

In the non-pixel area NPXA, the third color filter CF3 may be disposed over the barrier wall BW. The first color filter CF1 may be disposed on the third color filter CF3. The second color filter CF2 may be disposed on the first color filter CF1.

Each of the first to third color filters CF1, CF2, and CF3 transmits light in a specific wavelength range, and cuts off light other than the specific wavelength range. Each of the first to third color filters CF1, CF2, and CF3 includes a base resin and a dye and/or a pigment dispersed in the base resin. The base resin is a material in which the dye and/or the pigment is dispersed, and may be composed of various resin compositions that are typically referred to as a binder.

The first color filter CF1 may transmit first color light, the second color filter CF2 may transmit the source light provided from the light emitting layer EML, and the third color filter CF3 may transmit third color light. For example, the first color filter CF1 may be a red color filter, the second color filter may be a blue color filter, and the third color filter CF3 may be a green color filter. In an embodiment of the invention, the first and third color filters CF1 and CF3 may be yellow color filters. In this case, the first color filter CF1 may be provided in connection with the third color filter CF3.

The first color filter CF1 may be disposed adjacent to the second color filter CF2. The third color filter CF3 may overlap the first color filter CF1 and the second color filter CF2 in a plan view. An area in which all the plurality of color filters CF1, CF2, and CF3 overlap each other may shield light. In this case, a black matrix (not shown) including a light shielding material may not be included. The area in which all the plurality of color filters CF1, CF2, and CF3 overlap each other in a plan view may correspond to the non-pixel area NPXA, and correspond to the barrier wall BW. Here, the "correspond to" means that when viewed from the thickness direction DR3 of the display device DP, two components overlap each other in a plan view, and is not limited to having the same area.

The first insulating layer 200-1 may be disposed under the first to third color filters CF1, CF2, and CF3, and cover the first to third color filters CF1, CF2, and CF3. The second insulating layer 200-2 may cover the first insulating layer 200-1 and provide a planarization surface in the bottom side. The first insulating layer 200-1 may be an organic film, and the second insulating layer 200-2 may be an organic film. However, this is an example, and the second insulating layer 200-2 according to an embodiment of the invention may be omitted.

The barrier wall BW may be disposed under the second insulating layer 200-2. The barrier wall BW may be disposed in the non-pixel area NPXA. A plurality of first openings BW-OP1 may be defined in the barrier wall BW. The barrier wall BW may include a material having a transmissivity of a prescribed value or smaller. For example, the barrier wall BW may include a light shielding material, for example, a typical black component. The barrier wall BW may include a black dye, or a black pigment mixed in the base resin. For example, the barrier wall BW may include at least any one among propylene glycol methyl ether acetate, 3-methoxy-n-butyl acetate, acrylate monomer, acryl320 monomer, organ320 pigment, or acrylate ester.

The bottom surface BW-B of the barrier wall BW may be defined on a surface facing the thin-film encapsulation layer TFE.

A plurality of first openings BW-OP1 may correspond to the first pixel area PXA1, the second pixel area PXA2, and the third pixel area PXA3, respectively. The plurality of openings BW-OP1 may correspond to the first light emitting area EA1, the second light emitting area EA2, and the third light emitting area EA3, respectively. Here, the "correspond to" means that when viewed from the thickness direction DR3 of the display panel DP, the two components overlap each other, and this is not limited to having the same area.

The first light control pattern WC1 may be disposed inside one opening among the plurality of first openings BW-OP1, and convert the source light into the first color light. The second light control pattern WC2 may disposed inside one opening among the plurality of first openings BW-OP1, and transmit the source light. The third light control pattern WC3 may disposed inside one opening among the plurality of first openings BW-OP1, and convert the source light into the second color light.

Each of the first light control pattern WC1, the second light control pattern WC2, and the third light control pattern WC3 may be provided through an inkjet process. Spaces defined by the barrier wall BW, for example, the plurality of first openings BW-OP1 are provided with compositions to provide the first light control pattern WC1, the second light control pattern WC2, and the third light control pattern WC3.

Each of the first light control pattern WC1 and the third light control pattern WC3 may include a base resin, a quantum dot, and a scattering particle, and the second light control pattern WC2 may include a base resin and a scattering particle. However, this is an example, and each of the first to third light control patterns WC1, WC2, and WC3 may include a base resin and a scattering particle, and at least two patterns among the first to third light control patterns WC1, WC2, and WC3 may include quantum dots. In an embodiment of the invention, the scattering particle may be omitted from any one among the first to third light control patterns WC1, WC2, and WC3.

The base resin is a material in which the quantum dots or the scattering particles are dispersed, and may be composed of various resin compositions that are typically referred to as a binder. However, the embodiment is not limited thereto, and, in the specification, a material in which the quantum dots are dispersed may be referred to as the base resin, regardless of the name thereof, an additional other function, a composition material or the like. The base resin may be a polymer resin. For example, the base resin may be an acrylic-based resin, a urethane-based resin, a silicone-based resin, an epoxy-based resin or the like. The base resin may be a transparent resin.

The scattering particle may be a titanium oxide ($TiO_2$), a silica-based nano particle or the like. The scattering particle may scatter incident light to increase an amount of light provided to the outside. In an embodiment of the invention, at least one of the first light control pattern WC1 or the third light control pattern WC3 may not include the scattering particle.

The quantum dot may be a particle that converts a wavelength of incident light. The quantum dot is a material having a crystalline structure of several nanometers in size, is composed of several hundred to thousand atoms, and shows a quantum confinement effect in which an energy band gap is increased due to a small size. When light having a wavelength of higher energy than the band gap is incident to the quantum dot, the quantum dot absorbs the light to become an excited state, and then decays to the ground state while emitting light of a specific wavelength. The emitted light has a value corresponding to the band gap. When the size and composition of the quantum dot are adjusted, the emission characteristics due to the quantum confinement effect may be adjusted.

The core of the quantum dot may be selected from among a group II-VI compound, a group III-V compound, a group III-VI compound, a group compound, a group IV-VI compound, a group IV element, a group IV compound, or a combination thereof.

The group II-VI compound may be selected from a group consisting of: a binary compound selected from a group consisting of CdSe, CdTe, ZnS, ZnSe, ZnTe, ZnO, HgS, HgSe, HgTe, MgSe, MgS, and a mixture thereof a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-VI compound may include: a binary compound such as $In_2S_3$, $In_2Se_3$ or the like; a ternary compound such as $InGaS_3$, $InGaSe_3$ or the like; or an arbitrary combination thereof.

The group compound may be selected from among: a ternary compound selected from a group consisting of $AgInS$, $AgInS_2$, $CuInS$, $CuInS_2$, $AgGaS_2$, $CuGaS_2$ $CuGaO_2$, $AgGaO_2$, $AgAlO_2$ and a mixture thereof; or a quaternary compound such as $AgInGaS_2$, $CuInGaS_2$ or the like.

The group III-V compound includes one selected from a group consisting of: a binary compound selected from a group consisting of GaN, GaP, GaAs, GaSb, AlN, AlP, AlAs, AlSb, InN, InP, InAs, InSb, and a mixture thereof, a ternary compound selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. On the other hand, the group III-V compound may further include a group II metal. For example, InZnP or the like may be selected as the group III-II-V compound.

The group IV-VI compound may be selected from a group consisting of: a binary compound selected from a group consisting of SnS, SnSe, SnTe, PbS, PbSe, PbTe, and a mixture thereof; a ternary compound selected from a group consisting of SnSeS, SnSeTe, SnSTe, PbSeS, PbSeTe, PbSTe, SnPbS, SnPbSe, SnPbTe, and a mixture thereof, and a quaternary compound selected from a group consisting of SnPbSSe, SnPbSeTe, SnPbSTe, and a mixture thereof. The group IV element may be selected from a group consisting of Si, Ge, and a mixture thereof. The group IV compound may be a binary compound selected from a group consisting of S320, SiGe, and a mixture thereof.

Here, the binary compound, the ternary compound, or the quaternary compound may be present inside a particle in uniform concentrations, or present in the same particle in a state where concentration distributions are partially divided into different states. In addition, the binary compound, the ternary compound, or the quaternary compound may have a core/shell structure in which one quantum dot surrounds another quantum dot. The interface between the core and the shell may have a concentration gradient in which the concentration of elements present in the shell becomes lower toward the core.

In some embodiments, the quantum dots may have a core/shell structure having a core including the foregoing nano crystals and a shell surrounding the core. The shell of the quantum dots may serve as a protection layer for preventing the core from being chemically modified and maintaining the semiconductor characteristics and/or a charging layer for giving the electrophoretic characteristics to the quantum dots. The shell may be a single layer or a multi-layer. The interface between the core and the shell may have a concentration gradient in which the concentration of elements present in the shell becomes lower toward the core. The shell of the quantum dots may be exemplified with a metal or non-metal oxide, a semiconductor compound, or a combination thereof.

For example, the metal or non-metal oxide may be exemplified with: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO or the like; or a ternary compound such as $MgAl_2O_4$, $CoFe_2O_4$, $NiFe_2O_4$, $CoMn_2O_4$ or the like, but the embodiment of the invention is not limited thereto.

Alternatively, the semiconductor compound may be exemplified with CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb or the like, but the embodiment of the invention is not limited thereto.

The quantum dots may have a full width of half maximum ("FWHM") of an emission wavelength spectrum of about 45 nm or shorter, preferably about 40 nm or shorter, more preferably about 30 nm or shorter, and in this range, the color purity or color gamut may be improved. In addition, light emitted through such quantum dots is emitted omni-directionally, and thus the viewing angle of the light may be improved.

In addition, the shape of the quantum dots is not particularly limited to that typically used in this art, but more specifically, the shape of a spherical, pyramidal, multi-arm, or nano particle of cube (cub320), a nano tube, a nanowire, a nano fiber, a nano-planar particle or the like may be used.

The color of light emitted from the quantum dots may be adjusted according to the size of the particle, and accordingly, the quantum dots may have various emission colors such as blue, red, green or the like.

The third insulating layer 200-3 may cover the barrier wall BW, and the first to third light control patterns WC1, WC2, and WC3. For example, the third insulating layer 200-3 may be an inorganic film that encapsulates the barrier wall BW, and the first to third light control patterns WC1, WC2, and WC3.

Figure 5:
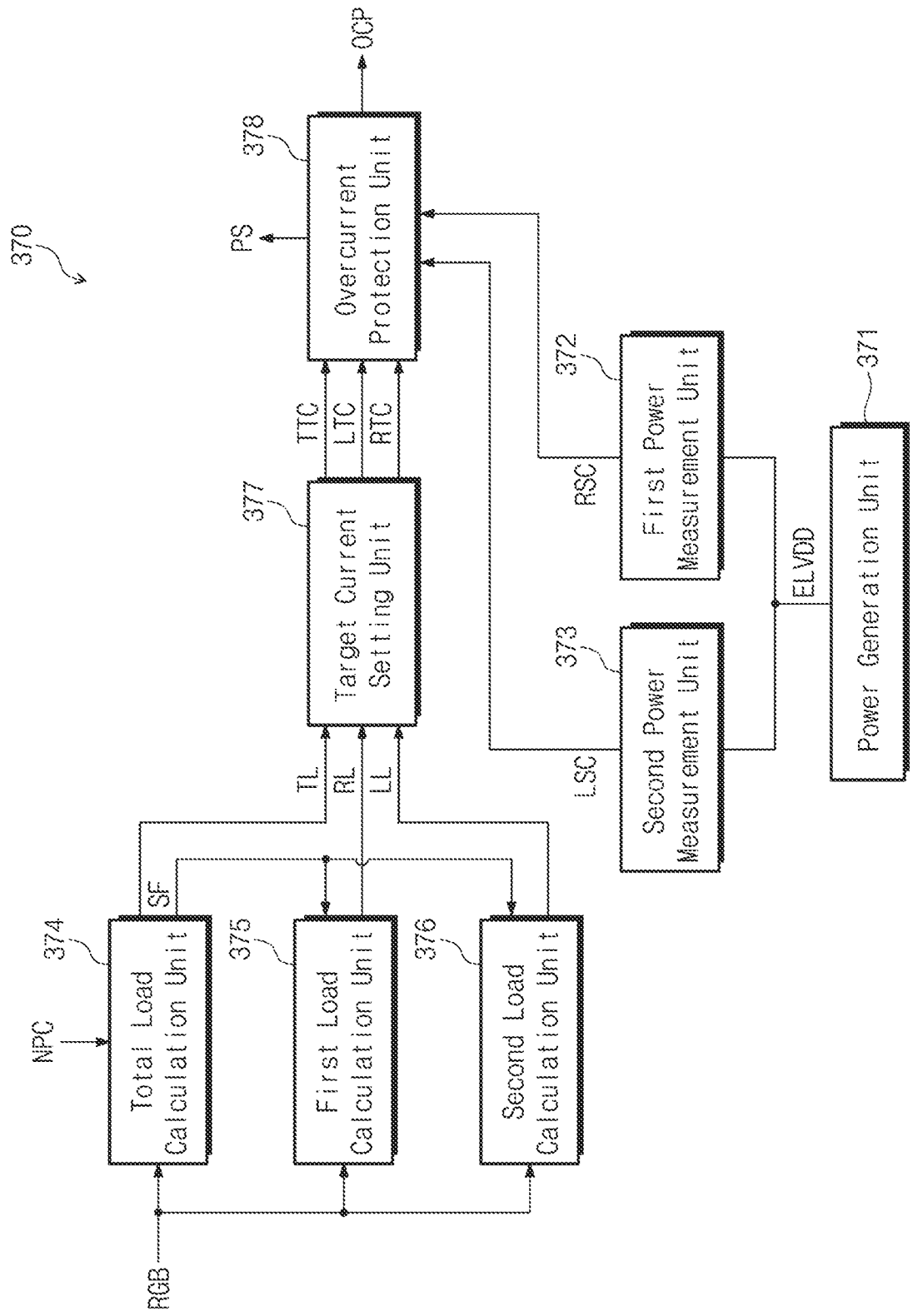
FIG. 5 is a block diagram of a main circuit board according to an embodiment of the invention.

FIG. 5 is a block diagram of a main circuit board according to an embodiment of the invention.

Referring to FIGS. 3 and 5, the main circuit board 370 may include a power generation unit 371, a first power measurement unit 372, a second power measurement unit 373, a total load calculation unit 374, a first load calculation unit 375, a second load calculation unit 376, a target current setting unit 377, and an overcurrent protection unit 378.

The power generation unit 371 may generate power ELVDD. The power generation unit 371 may provide the power ELVDD to the display panel DP.

The first power measurement unit 372 may be electrically connected with the first circuit cable 350 and the power generation unit 371. The first power measurement unit 372 may measure a first current RSC of the power provided to a first region AR1. The first current RSC may be provided to the power line PL through the first power pad PD1-1.

The second power measurement unit 373 may be electrically connected with the second circuit cable 360 and the power generation unit 371. The second power measurement unit 373 may measure a second current LSC of the power provided to a second region AR2. The second current LSC may be provided to the power line PL through the first power pad PD1-2.

Unlike the invention, when the power ELVDD is transferred to the power line PL through a single wiring, a high current may flow through the wiring due to a high voltage level of the power ELVDD. Accordingly, the wiring may be damaged. The power ELVDD may be transferred to the power line PL through the wiring. Accordingly, the power line PL may be damaged. However, according to the invention, the power ELVDD may be divided into the first current RSC and the second current LSC in parallel to be provided to the power line PL. The first current RSC may be transferred to the power line PL through the first circuit cable 350, the first circuit board 330, and the plurality of first circuit films 311. The second current LSC may be transferred to the power line PL through the second circuit cable 360, the second circuit board 340, and the plurality of second circuit films 312. When the power ELVDD is divided into the first current RSC and the second current LSC and provided to the power line PL, the power ELVDD may be transferred to the display panel DP at a lower current in comparison to a case of being transferred to the power line PL through a single wiring. In other words, the power line PL and the lines of the plurality of first circuit films 311, the plurality of second circuit films 312, the first circuit board 330, the second circuit board 340, the first circuit cable 350, the second circuit cable 360, and the main circuit board 370 may be prevented from being damaged. Accordingly, the electronic device 1000 with improved reliability may be provided.

The total load calculation unit 374 may receive an image signal RGB. The total load calculation unit 374 may output a load of the display panel DP on the basis of the image signal RGB. Here, the load may refer to a ratio of light emitting pixels in the display panel DP. For example, when the display panel DP emits full-white light, the load may be set to 100%. The total load calculation unit 374 may output the total load TL on the basis of the image signal RGB.

The total load calculation unit 374 may receive a limitation signal NPC from the outside. The electronic device 1000 may limit the current flowing through the display panel in correspondence to the load of the image signal RGB in order to minimize power consumption. The current may be limited on the basis of the limitation signal NPC. This may be referred to as Net Power Control. The limitation signal NPC may be arbitrarily set and provided by a user in order to calculate a current control signal SF for scaling the current. The limitation signal NPC may be set to be larger than about 0 and be equal to or smaller than about 1. For example, the limitation signal NPC may be provided as about 0.2 (20%). However, this is an example, and the limitation signal NPC according to an embodiment of the invention is not limited thereto.

The total load calculation unit 374 may control bits of data of the image signal RGB so that a current amount of the display panel DP is limited in correspondence to the total load TL of the image signal RGB. This may be referred to as data scaling. The total load calculation unit 374 may generate the current control signal SF on the basis of the total load TL of the image signal RGB and the limitation signal NPC. The current control signal SF may have a value of about 0 to about 1, and when the generated current control signal is about 1 or larger, the current control signal SF may be limited to about 1. The limitation signal NPC may be provided as a constant value by the user, and the total load TL and the current control signal SF may be inversely proportional to each other. For example, when the limitation signal NPC is about 0.2, and the load is about 1.0 (100%), the current control signal SF may be about 0.2 (20%). In this case, when a panel's maximum brightness proportional to the current is about 600 nit, the maximum emission brightness of the load may be about 120 nit due to the current control signal SF. However, this is an example, and the current control signal SF according to an embodiment of the invention is not limited thereto.

The first load calculation unit 375 may receive the image signal RGB and the current control signal SF. The first load calculation unit 375 may calculate a first load RL on the basis of an image signal for the first region AR1 of the image signal RGB and the current control signal SF. The first load RL may provide a load for the first region AR1. The second load calculation unit 376 may receive the image signal RGB and the current control signal SF. The second load calculation unit 376 may calculate a second load LL on the basis of an image signal for the second region AR2 of the image signal RGB and the current control signal SF. For example, when the total load TL is determined as about 1.0 (100%) from the image signal RGB, and the first load RL is about 0.5 (50%), then the second load calculation unit 376 may output the second load LL as 0.5 (50%) on the basis of the image signal for the second region AR2 and the current control signal SF. Alternatively, when the total load TL is determined as about 0.2 (20%) from the image signal RGB, and the first load RL is about 0.19 (19%), then the second load calculation unit 376 may output the second load LL as 0.01 (1%) on the basis of the image signal for the second region AR2 and the current control signal SF. The target current setting unit 377 may receive the total load TL, the first load RL, and the second load LL. The target current setting unit 377 may select a total target current TTC, a first target current RTC, and a second target current LTC on the basis of the total load TL, the first load RL and the second load LL. The total target current TTC may refer to the current provided to the display panel DP. The target current setting unit 377 may select the total target current TTC on the basis of a prestored lookup table regarding relations of total loads TL and total target currents TTC. The first target current RTC may refer to the current provided to the first region AR1. The target current setting unit 377 may select the first target current RTC on the basis of a prestored lookup table regarding relations of first loads RL and first target currents RTC. The second target current LTC may refer to the current provided to the second region AR2. The target current setting unit 377 may select the second target current LTC on the basis of a prestored lookup table regarding relations of second loads LL and second target currents LTC.

The overcurrent protection unit 378 may output a reference current OCP on the basis of the first target current RTC and the second target current LTC.

For example, reference currents OCP are stored in a form of a lookup table in an external memory or the like, and thus the overcurrent protection unit 378 may correspond to the reference current OCP suitable for a situation on the basis of the first target current RTC and the second target current LTC.

Alternatively, the reference current OCP may be calculated by multiplying each of the first target current RTC and the second target current LTC by a prescribed ratio. For example, the overcurrent protection unit 378 may set the margin of the reference current OCP to 20%. In this case, the overcurrent protection unit 378 may set a current corresponding to 120% of each of the first target current RTC and the second target current LTC as the reference current OCP.

However, this is an example, and a method for calculating the reference current OCP according to an embodiment of the invention is not limited thereto. In another embodiment, for example, regardless of the first target current RTC and the second target current LTC, the reference current OCP may have a prescribed current value determined in advance. For example, the reference current OCP may be set to about 4 milliamperes (mA).

The reference current OCP may include a total reference current, a first reference current, and a second reference current. The first reference current may be obtained by calculating the reference current for the first region AR1. The second reference current may be obtained by calculating the reference current for the second region AR2. The reference current OCP may provide a reference for determining whether the first current RSC or the second current LSC is in an overcurrent state.

The overcurrent protection unit 378 may determine whether to cut off the power ELVDD on the basis of the first current RSC, the second current LSC, and the reference current OCP. The overcurrent protection unit 378 may determine whether there is an overcurrent by comparing the provided reference current OCP with actually measured first and second currents RSC and LSC on the basis of the first and second target currents RTC and LTC to be provided to the first and second regions AR1 and AR2 of the display panel DP, respectively, and may determine whether to cut off the power ELVDD. When the power ELVDD is required to be cut off, the overcurrent protection unit 378 may generate a protection signal PS. The protection signal PS may cut off the power ELVDD generated from the power generation unit 371 to prevent the overcurrent from being applied to the display panel DP. The electronic device 1000 may protect the display panel DP through the protection signal PS.

Figure 6:
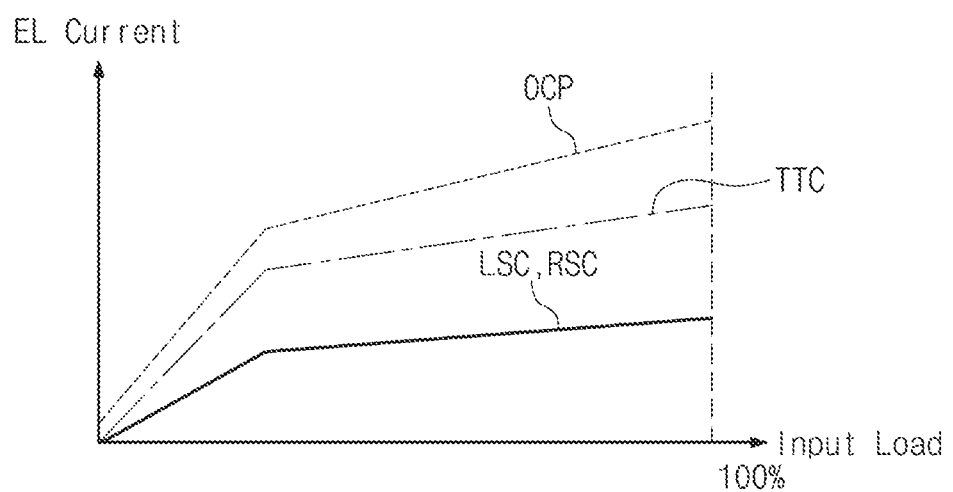
FIG. 6 illustrates a graph of load vs. current according to an embodiment of the invention.

FIG. 6 illustrates a graph of load vs. current according to an embodiment of the invention.

Referring to FIGS. 5 and 6, the overcurrent protection unit 378 may compare the reference current OCP, the total target current TTC, the first current RSC, and the second current LSC.

In a steady state, the reference current OCP may be larger than each of the first current RSC and the second current LSC. For example, the total target current TTC may be the sum of the first current RSC and the second current LSC. The reference current OCP may be larger than the total target current TTC. The reference current OCP may be larger than the sum of the first current RSC and the second current LSC.

When the reference current OCP is larger than each of the first current RSC and the second current LSC, the overcurrent protection unit 378 may not cut off the power ELVDD.

According to the invention, the electronic device 1000 may easily determine whether the current provided to the display panel DP is an overcurrent. The overcurrent protection unit 378 may determine whether to cut off the power ELVDD by comparing the reference current OCP with the first current RSC and the second current LSC that are measured in real time. The overcurrent protection unit 378 may prevent the overcurrent from being provided to the display panel DP. The overcurrent protection unit 378 may prevent a phenomenon in which the power line PL is burnt out due to the overcurrent. In other words, the stability of the power line PL may be secured. Accordingly, the electronic device 1000 with improved reliability may be provided.

Figure 7:
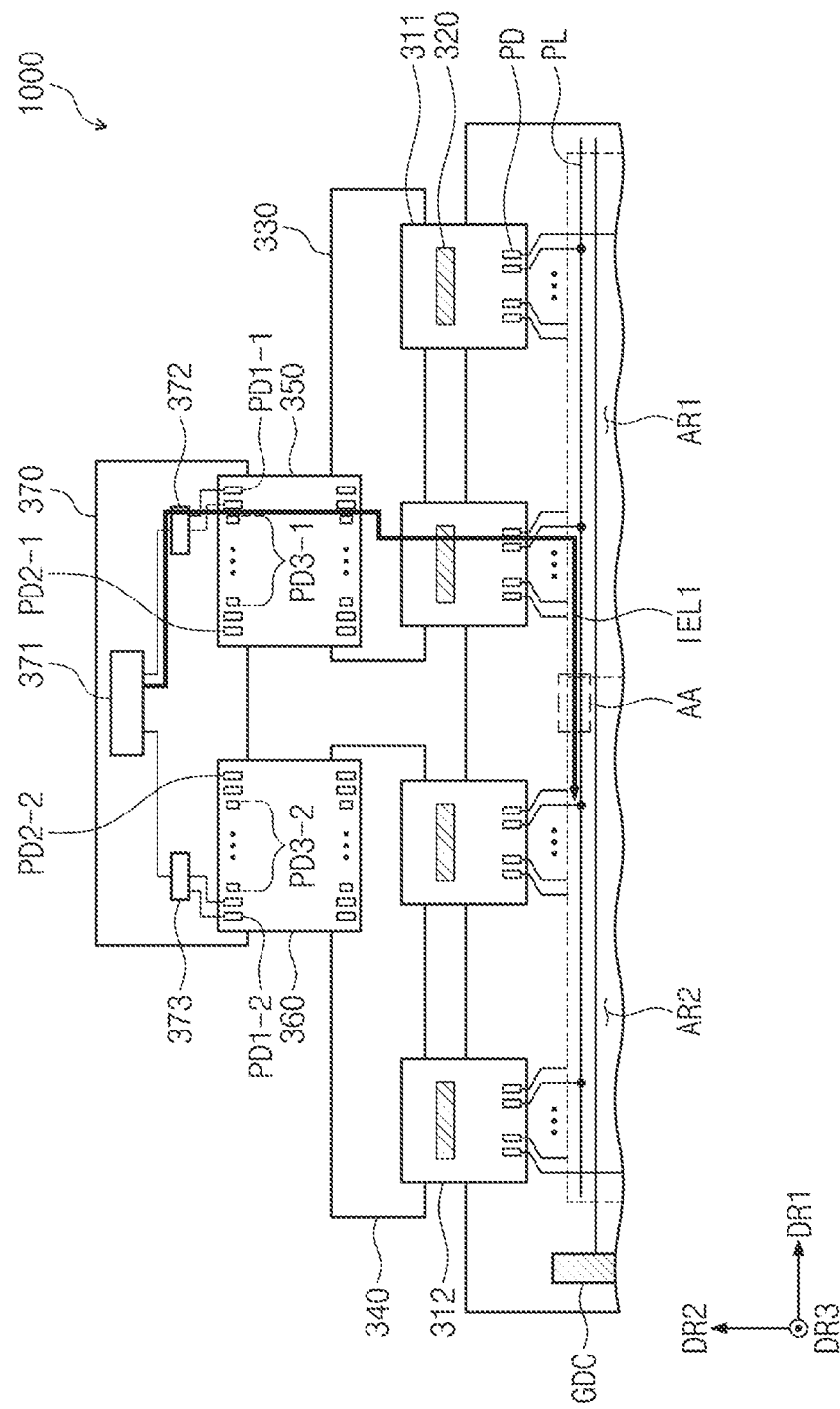
FIG. 7 is a plan view of an electronic device according to an embodiment of the invention.
Figure 8:
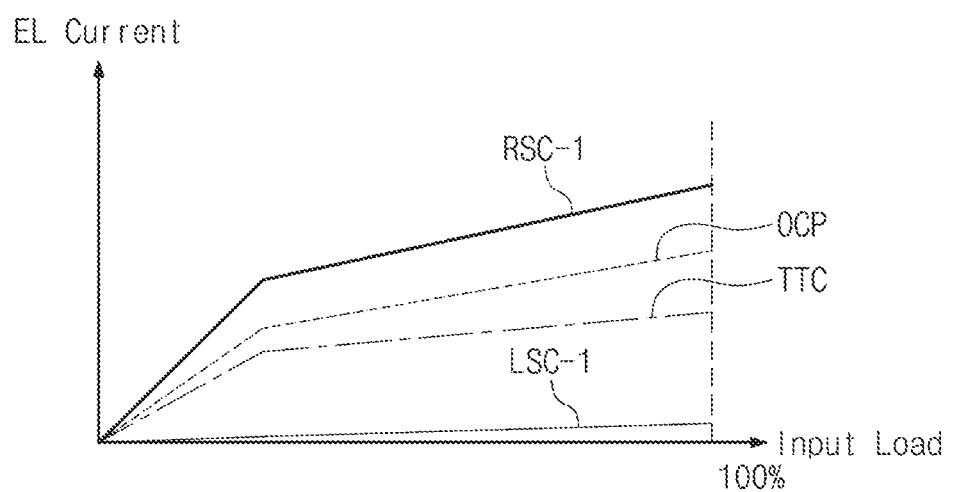
FIG. 8 illustrates a graph of load vs. current according to the embodiment of FIG. 7.

FIG. 7 is a plan view of an electronic device according to an embodiment of the invention, and FIG. 8 is a graph of load vs. current according to the embodiment of FIG. 7. In FIG. 7, an example of the second circuit cable 360 being erroneously coupled to the second circuit board 340 is illustrated. In description about FIG. 7, like reference numerals are given to like elements described with reference to FIG. 3, and descriptions thereabout will be omitted.

Referring to FIGS. 5, 7, and 8, the power ELVDD generated by the power generation unit 371 may include first power and second power.

In a process of manufacturing the electronic device 1000, when the second circuit cable 360 is erroneously coupled to the second circuit board 340, the resistance of the first power pad PD1-2 in the second circuit cable 360 may increase.

The first power may be provided to the first region AR1 through the first circuit cable 350. Accordingly, the current amount of the first current RSC-1 flowing to the first circuit board 330, which has relatively low resistance, may increase.

The second power may be provided to the second region AR2 through the second circuit cable 360. Accordingly, the current amount of the second current LSC-1 flowing to the second circuit board 340, which has relatively high resistance, may decrease.

In other words, a phenomenon may occur in which due to the erroneous coupling of the second circuit cable 360, a current of the flexible circuit film, which transfers the power ELVDD, is abnormally pushed to the first circuit cable 350.

The first power measurement unit 372 may measure the first current RSC-1. For example, although the first current RSC (see FIG. 3) of the electronic device 1000 in a steady state is about 0.8 amperes (A), the first current RSC-1 of the electronic device 1000 in the erroneously coupled state may increase to its maximum value: about 10.8 A.

The second power measurement unit 373 may measure the second current LSC-1.

The overcurrent protection unit 378 may receive the first current RSC-1 and the second current LSC-1 from the first power measurement unit 372 and the second power measurement unit 373, respectively. The overcurrent protection unit 378 may determine whether to cut off the power ELVDD on the basis of the first current RSC-1, the second current LSC-1, and the reference current OCP.

The overcurrent protection unit 378 may compare the reference current OCP, the total target current TTC, the first current RSC-1, and the second current LSC-1.

In a state where the second circuit cable 360 is erroneously coupled, the first current RSC-1 may be larger than the reference current OCP.

When at least one of the first current RSC-1 or the second current LSC-1 is larger than the reference current OCP, the overcurrent protection unit 378 may generate the protection signal PS. The protection signal PS may cut off the power ELVDD generated from the power generation unit 371. The overcurrent protection unit 378 may prevent the overcurrent IEL1 from being provided to the display panel DP.

The overcurrent protection unit 378 may determine whether the first circuit cable 350 is connected with the second circuit cable 360 on the basis that there is the overcurrent IEL1

According to the invention, the electronic device 1000 may easily determine whether the current provided to the display panel DP is an overcurrent. The overcurrent protection unit 378 may determine whether to cut off the power ELVDD by comparing the reference current OCP with the first current RSC-1 and the second current LSC-1 that are measured in real time. The overcurrent protection unit 378 may cut off the power ELVDD provided from the power generation unit 371 by the protection signal PS. The overcurrent protection unit 378 may prevent the overcurrent IEL1 from being provided to the display panel DP. The overcurrent protection unit 378 may prevent a phenomenon in which the plurality of pads PD and the power line PL are burnt due to the overcurrent TELL In other words, the phenomenon may be prevented in which a burnout occurs in the area AA that is between the first region AR1 and the second region AR2 and through which the overcurrent IEL1 may flow. Accordingly, the electronic device 1000 with improved reliability may be provided.

In addition, according to an embodiment of the invention, the overcurrent protection unit 378 may determine whether the overcurrent IEL1 is applied in a test step of the electronic device 1000. The overcurrent protection unit 378 may determine whether the first circuit cable 350 is connected with the second circuit cable 360 on the basis that there is the overcurrent IEL1, and provide the determination result to the user. In the process of manufacturing the electronic device 1000, when the second circuit cable 360 is erroneously coupled to the second circuit board 340, the overcurrent protection unit 378 may easily determine the erroneous coupling in the test step of the electronic device 1000. The user may easily detect the erroneous coupling between the second circuit cable 360 and the second circuit board 340, and make the second circuit cable 360 and the second circuit board 340 be normally coupled. The user may control the second circuit cable 360 to be coupled with the second circuit board 340 again and the electronic device 1000 to normally operate. Accordingly, the electronic device 1000 with improved reliability may be provided.

Figure 9:
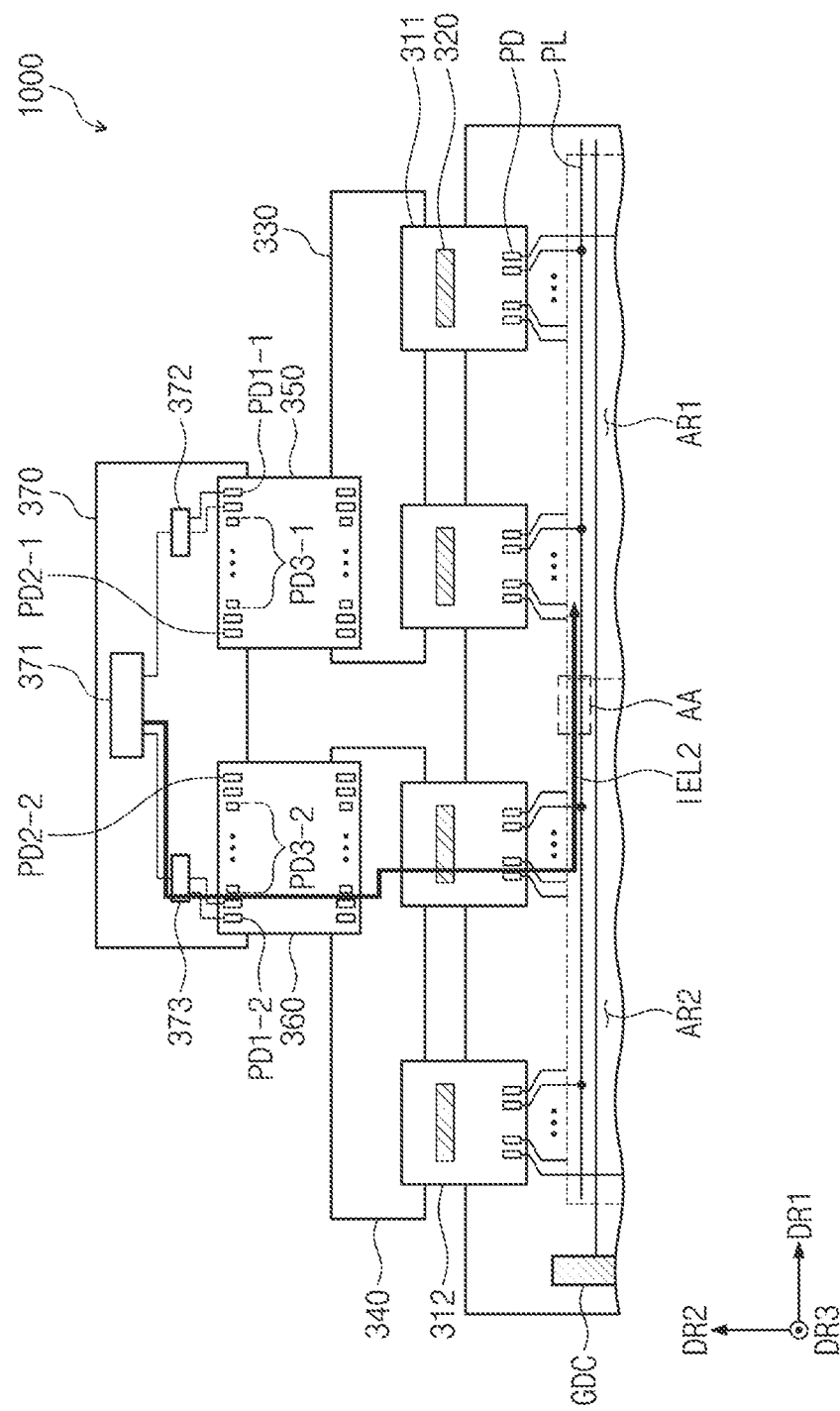
FIG. 9 is a plan view of an electronic device according to an embodiment of the invention.
Figure 10:
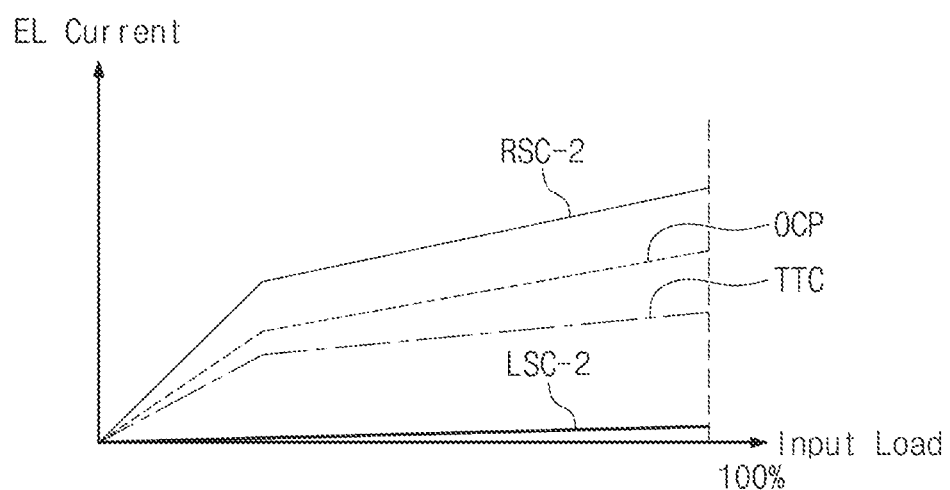
FIG. 10 illustrates a graph of load vs. current according to the embodiment of FIG. 9.

FIG. 9 is a plan view of an electronic device according to an embodiment of the invention, and FIG. 10 is a graph of load vs. current according to the embodiment of FIG. 9. In FIG. 9, an example of the first circuit cable 350 erroneously coupled to the first circuit board 330 is illustrated. In description about FIG. 9, like reference numerals are given to like elements described with reference to FIGS. 3 and 7, and descriptions thereabout will be omitted.

Referring to FIGS. 5, 9, and 10, in the process of manufacturing the electronic device 1000, when the first circuit cable 350 is erroneously coupled to the first circuit board 330, the resistance of the first power pad PD1-1 in the first circuit cable 350 may increase. The first power of the power ELVDD may be provided to the first region AR1 through the first circuit cable 350. Accordingly, the current amount of the first current RSC-2 flowing to the first circuit board 330, which has relatively high resistance, may decrease.

The second power of the power ELVDD may be provided to the second region AR2 through the second circuit cable 360. Accordingly, the current amount of the second current LSC-2 flowing to the second circuit board 340, which has relatively low resistance, may increase.

In other words, a phenomenon may occur in which due to the erroneous coupling of the first circuit cable 350, a current of the flexible circuit film, which transfers the power ELVDD, is abnormally pushed to the second circuit cable 360.

The first power measurement unit 372 may measure the first current RSC-2.

The second power measurement unit 373 may measure the second current LSC-2. For example, the second current LSC (see FIG. 3) of the electronic device 1000 in a steady state is about 0.8 A, and the second current RSC of the electronic device 1000 in the erroneously coupled state may increase to its maximum value: about 10.8 A.

The overcurrent protection unit 378 may receive the first current RSC-2 and the second current LSC-2 from the first power measurement unit 372 and the second power measurement unit 373, respectively. The overcurrent protection unit 378 may determine whether to cut off the power ELVDD on the basis of the first current RSC-2, the second current LSC-2, and the reference current OCP.

The overcurrent protection unit 378 may compare the reference current OCP, the total target current TTC, the first current RSC-2, and the second current LSC-2.

In a state where the second circuit cable 360 is erroneously coupled, the first current RSC-2 may be larger than the reference current OCP.

When at least one of the first current RSC-2 or the second current LSC-2 is larger than the reference current OCP, the overcurrent protection unit 378 may generate the protection signal PS. The protection signal PS may cut off the power ELVDD generated from the power generation unit 371. The overcurrent protection unit 378 may prevent the overcurrent IEL2 from being provided to the display panel DP.

According to the invention, the electronic device 1000 may easily determine whether the current provided to the display panel DP is an overcurrent. The overcurrent protection unit 378 may determine whether to cut off the power ELVDD by comparing the reference current OCP with the first current RSC-2 and the second current LSC-2 that are measured in real time. The overcurrent protection unit 378 may cut off the power ELVDD of the power generation unit 371 through the protection signal PS. The overcurrent protection unit 378 may prevent the overcurrent IEL2 from being provided to the display panel DP. The overcurrent protection unit 378 may prevent a phenomenon in which the plurality of pads PD and the power line PL are burnt due to the overcurrent IEL2. In other words, a phenomenon may be prevented in which a burnout occurs in the area AA that is between the first region AR1 and the second region AR2 and through which the overcurrent IEL2 flows. Accordingly, the electronic device 1000 with improved reliability may be provided.

In addition, according to an embodiment of the invention, the overcurrent protection unit 378 may determine whether there is the overcurrent IEL2 in a test step of the electronic device 1000. The overcurrent protection unit 378 may determine whether the first circuit cable 350 is connected with the second circuit cable 360 on the basis that the overcurrent IEL2 is applied, and provide the determination result to the user. In the process of manufacturing the electronic device 1000, when the first circuit cable 350 is erroneously coupled to the first circuit board 330, the overcurrent protection unit 378 may easily determine the erroneous coupling in the test step of the electronic device 1000. The user may easily detect the erroneous coupling between the first circuit cable 350 and the first circuit board 330, and make the first circuit cable 350 and the first circuit board 330 be normally coupled. The user may control the first circuit cable 350 to be coupled with the first circuit board 330 again and the electronic device 1000 to normally operate. Accordingly, the electronic device 1000 with improved reliability may be provided.

According to the invention, the electronic device may easily determine whether a current provided to the display panel is an overcurrent. The overcurrent protection unit may compare the reference current with the measured first current and second current to determine whether to cut off the power. The overcurrent protection unit may prevent the overcurrent from being provided to the display panel. The overcurrent protection unit may prevent a phenomenon in which a power line is burnt out due to the overcurrent. In other words, the stability of the display panel may be secured. Accordingly, the electronic device with improved reliability may be provided.

While this invention has been described with reference to exemplary embodiments thereof, it will be clear to those of ordinary skill in the art to which the invention pertains that various changes and modifications may be made to the described embodiments without departing from the spirit and technical area of the invention as defined in the appended claims and their equivalents. Thus, the scope of the invention shall not be restricted or limited by the foregoing description, but be determined by the broadest permissible interpretation of the following claims.

As used in connection with various embodiments of the disclosure, the term "unit" may include a unit implemented in hardware, software, or firmware, and may be interchangeably used with other terms, for example, "logic," "logic block," "part," or "circuitry". A unit may be a single integral component, or a minimum unit or part thereof, adapted to perform one or more functions. For example, according to an embodiment of the disclosure, the unit may be implemented in a form of an application-specific integrated circuit (ASIC).

What is claimed is:

1. An electronic device comprising:
a display panel in which an active area and a non-active area adjacent to the active area are defined, wherein the active area includes a first region and a second region adjacent to the first region in a first direction;
a plurality of first circuit films electrically connected with the first region;
a plurality of second circuit films electrically connected with the second region;
a first circuit board electrically connected with the plurality of first circuit films;
a second circuit board electrically connected with the plurality of second circuit films;
a first circuit cable electrically connected with the first circuit board;
a second circuit cable electrically connected with the second circuit board; and
a main circuit board electrically connected with the first circuit cable and the second circuit cable, and, which receives an image signal and outputs a protection signal,
wherein the main circuit board comprises:
a power generation unit, which provides power to the display panel;
a first power measurement unit electrically connected with the first circuit cable and the power generation unit, and, which measures a first current provided to the first region through the first circuit cable and the first circuit board;
a second power measurement unit electrically connected to the second circuit cable and the power generation unit, and, which measures a second current provided to the second region through the second circuit cable and the second circuit board; and
an overcurrent protection unit, which determines whether to output the protection signal for cutting off the power based on a reference current output according to the image signal and each of the first and second currents.

2. The electronic device of claim 1, wherein the first circuit cable comprises a first power pad and a plurality of first pads spaced apart from the first power pad in the first direction, the first power pad is electrically connected to the power generation unit,
the second circuit cable comprises a second power pad and a plurality of second pads spaced apart from the second power pad in the first direction, the second power pad is electrically connected to the power generation unit, and
the display panel comprises a power line electrically connected to the first power pad and the second power pad,
wherein the power line extends in the first direction.

3. The electronic device of claim 2, wherein the first current is provided to the first power pad, and
the second current is provided to the second power pad.

4. The electronic device of claim 1, further comprising:
driving chips mounted on the plurality of first circuit films and the plurality of second circuit films, respectively.

5. The electronic device of claim 1, wherein the main circuit board further comprises:

a total load calculation unit, which receives the image signal, generates a current control signal for the first region and the second region based on the image signal, and calculates a total load for the active area based on the image signal;
a first load calculation unit, which receives the image signal and calculates a first load for the first region based on the image signal and the current control signal; and
a second load calculation unit, which receives the image signal and calculates a second load for the second region based on the image signal and the current control signal.

6. The electronic device of claim 5, further comprising:
a target current setting unit, which calculates a total target current provided to the display panel, a first target current provided to the first region, and a second target current provided to the second region based on the total load, the first load and the second load, and provides the total target current, the first target current, and the second target current to the overcurrent protection unit.

7. The electronic device of claim 6, wherein the overcurrent protection unit outputs the reference current based on the first target current and the second target current.

8. The electronic device of claim 7, wherein a current value of the reference current is output based on a lookup table regarding relations between the first target current, the second target current, or the reference current that are stored in advance.

9. The electronic device of claim 7, wherein the reference current has a current value obtained by multiplying a prescribed ratio by each of the first target current and the second target current.

10. The electronic device of claim 1, wherein the first region is a half of the active area, and the second region is another half of the active area.

11. The electronic device of claim 1, wherein the reference current comprises a total reference current, a first reference current for the first region, and a second reference current for the second region.

12. The electronic device of claim 6, wherein the reference current is larger than each of the first target current and the second target current.

13. The electronic device of claim 1, wherein when at least one of the first current or the second current is larger than the reference current, the overcurrent protection unit outputs the protection signal.

14. The electronic device of claim 1, wherein the overcurrent protection unit determines whether the first circuit cable or the second circuit cable is connected.

15. An electronic device testing method comprising:
providing an electronic device comprising a display panel in which an active area comprising a first region and a second region adjacent to the first region in a first direction, and a non-active area adjacent to the active area are defined, and a main circuit board electrically connected with the display panel and, which provides power comprising first power and second power to the display panel and receives an image signal;
providing the first power to the first region;
providing the second power to the second region;
measuring a first current of the first power;
measuring a second current of the second power; and
cutting off the power based on a reference current output according to the image signal and each of the first and second currents.

16. The electronic device testing method of claim 15, further comprising:
  receiving the image signal, generating a current control signal for the first region and the second region based on the image signal, and calculating a total load for the active area based on the image signal.

17. The electronic device testing method of claim 16, further comprising:
  receiving the image signal and calculating a first load for the first region based on the image signal and the current control signal; and
  receiving the image signal and calculating a second load for the second region based on the image signal and the current control signal.

18. The electronic device testing method of claim 17, further comprising:
  calculating a total target current provided to the display panel based on the total load, a first target current provided to the first region based on the first load, and a second target current provided to the second region based on the second load,
  wherein the cutting off the power comprises calculating the reference current based on the total target current, the first target current, and the second target current.

19. The electronic device testing method of claim 15, wherein the cutting off the power is not performed, when the reference current is larger than each of the first current and the second current.

20. The electronic device testing method of claim 15, wherein the cutting off the power is performed, when at least one of the first current or the second current is larger than the reference current.

* * * * *